(12) United States Patent
Wang et al.

(10) Patent No.: US 12,230,738 B2
(45) Date of Patent: Feb. 18, 2025

(54) FLIP-CHIP LIGHT-EMITTING DIODE AND HIGH-VOLTAGE FLIP-CHIP LIGHT-EMITTING DEVICE

(71) Applicant: XIAMEN SANAN OPTOELECTRONICS CO., LTD., Fujian (CN)

(72) Inventors: Feng Wang, Fujian (CN); Anhe He, Fujian (CN); Zhanggen Xia, Fujian (CN); Ensong Nie, Fujian (CN); Kang-Wei Peng, Fujian (CN); Su-Hui Lin, Fujian (CN)

(73) Assignee: XIAMEN SANAN OPTOELECTRONICS CO., Fujian (CN)

( * ) Notice: Subject to any disclaimer, the term of this patent is extended or adjusted under 35 U.S.C. 154(b) by 605 days.

(21) Appl. No.: 17/588,100

(22) Filed: Jan. 28, 2022

(65) Prior Publication Data
US 2022/0149243 A1 May 12, 2022

Related U.S. Application Data

(63) Continuation-in-part of application No. PCT/CN2019/099322, filed on Aug. 5, 2019.

(51) Int. Cl.
*H01L 33/38* (2010.01)
*H01L 33/10* (2010.01)
*H01L 33/20* (2010.01)
*H01L 33/32* (2010.01)
*H01L 33/62* (2010.01)

(52) U.S. Cl.
CPC ............ *H01L 33/382* (2013.01); *H01L 33/10* (2013.01); *H01L 33/20* (2013.01); *H01L 33/32* (2013.01); *H01L 33/62* (2013.01)

(58) Field of Classification Search
None
See application file for complete search history.

(56) References Cited

FOREIGN PATENT DOCUMENTS

| CN | 102867837 A | 1/2013 |
|---|---|---|
| CN | 104393135 A | 3/2015 |
| CN | 105737103 A | 7/2016 |
| CN | 109192833 A | 1/2019 |

OTHER PUBLICATIONS

Search Report issued to PCT application No. PCT/CN2019/099322 on Apr. 28, 2020.

*Primary Examiner* — Anthony Ho
(74) *Attorney, Agent, or Firm* — DLA PIPER LLP (US); Blake W. Jackson

(57) ABSTRACT

A flip-chip light-emitting diode (LED) includes: a substrate having a patterned surface formed with a protrusion unit including first and second protrusions; a light-emitting epitaxial layer that is disposed on the second protrusions and that includes first and second semiconductor layers and an active layer interposed therebetween; first and second electrodes connected to the first and second semiconductor layers, respectively; and a passivation layer having an epitaxial-covering portion and a substrate-covering portion. The substrate-covering portion of the passivation layer has a top surface with hillocks having a height lower than that of the second protrusions. A high-voltage light-emitting device is also disclosed.

22 Claims, 9 Drawing Sheets

FLIP-CHIP LIGHT-EMITTING DIODE AND HIGH-VOLTAGE FLIP-CHIP LIGHT-EMITTING DEVICE

CROSS-REFERENCE TO RELATED APPLICATION

This application is a continuation-in-part (CIP) application of PCT International Application No. PCT/CN2019/099322, filed on Aug. 5, 2019.

FIELD

The disclosure relates to a semiconductor device, and more particularly to a flip-chip light-emitting diode and a high-voltage flip-chip light-emitting device.

BACKGROUND

A light-emitting diode (LED) is a semiconductor device capable of converting electricity into light, and is classified into different types, such as a face-up LED, a flip-chip LED and a vertical LED according to positions of electrodes in a LED chip. In particular, the flip-chip LED is widely used in various applications such as general lighting, backlights, flash lamps, display screens and automotive lighting, etc., due to tolerance to higher driving current, better reliability, and no requirement of wire bonding process, etc.

As for blue LEDs or green LEDs, however, there is no lattice-matched substrate for growing an epitaxial layer made of group-III nitride-based compound semiconductors thereon. Compared with an epitaxial layer of other compound semiconductors (e.g., gallium arsenide compound semiconductors) having a lattice-matched substrate which has the same lattice constant with the compound semiconductors grown thereon (e.g., gallium arsenide), the epitaxial layer of the group-III nitride-based compound semiconductors directly grown on a lattice-mismatched substrate tends to have many dislocations and defects, which would adversely affect an active layer subsequently formed thereon. Thus, the photoelectric performance and mechanical properties of the LEDs thus obtained are poor, i.e., light extraction efficiency of the LEDs is poor and the LEDs are fragile during subsequent handling.

In order to improve the light extraction efficiency, photoelectric performance and mechanical properties of flip-chip LEDs, a patterned substrate is widely used for alleviating propagation of the dislocations into the epitaxial layer grown thereon. For example, in a gallium nitride-based LED for emitting blue light, patterning of a sapphire substrate is beneficial to epitaxial growth of a gallium nitride epitaxial layer and is able to alleviate reflection of light at an interface of the sapphire substrate and the gallium nitride epitaxial layer.

Referring to FIG. 1, a conventional flip-chip LED includes a patterned substrate 10, a light-emitting epitaxial layer 20 disposed on the patterned substrate 10, and a passivation layer 40 wrapping around the light-emitting epitaxial layer 20. The patterned substrate 10 is formed with protrusions 11 (e.g., conical protrusions) to improve the light extraction efficiency of the flip-chip LED. The passivation layer 40 serves as an isolation layer to avoid leakage current induced by leak of a solder paste that is used to bond the flip-chip LED to a submount in a flip-chip technology. With regard to a wafer including a plurality of the flip-chip LEDs, the passivation layer 40 could also be located between any two of the flip-chip LEDs in order to completely wrap the light-emitting epitaxial layer 20 of each of the flip-chip LEDs after the flip-chip LEDs are separated from each other.

From the perspective of the single flip-chip LED, formation of the passivation layer 40 includes: forming an isolation trench by removing portion of the light-emitting epitaxial layer 20 so as to expose a portion of the patterned substrate 10 at an outer periphery of the flip-chip LED; disposing the passivation layer 40 on a top and a side surface of the light-emitting epitaxial layer 20; and filling the passivation layer 40 into the isolation trench so as to cover the exposed portion of the patterned substrate 10. However, the exposed portion of the patterned substrate 10 has a plurality of stress concentration regions including a spacing between any two adjacent ones of the protrusions 11 and a peak of each of the protrusions 11 (e.g., conical protrusions). When the protrusions 11 become nucleation points, the passivation layer 40 disposed on the exposed portion of the patterned substrate 10 is formed into discontinuous islands.

Referring to FIG. 2, the passivation layer 40 disposed on the exposed portion of the patterned substrate 10 with the protrusions 11 does not have a flat surface and is prone to crack. During aging, a solder paste used for bumping would penetrate into the passivation layer 40 through cracks (a dark line as shown in FIG. 2) to be in contact with a bottom layer of the light-emitting epitaxial layer 20 that is made of undoped gallium nitride, which results in current leakage.

As a chip size of a LED continues to shrink, current leakage is more critical especially to a mini LED or a micro LED compared to a conventionally-sized LED that has a dimension of up to 1000 μm×1000 μm and a thickness of up to 500 μm. In addition, the exposed portion of the patterned substrate 10 formed with the protrusions 11 might adsorb metallic residues and dirt during chip manufacturing and die bonding processes to be subsequently performed, causing a residue of a solder paste used in the die bonding process to remain at an outer periphery of a LED chip, which results in high leakage current in an open/short test.

SUMMARY

Therefore, an object of the disclosure is to provide a flip-chip light-emitting diode that can alleviate or eliminate at least one of the drawbacks of the prior art.

According to one aspect of the disclosure, a flip-chip light-emitting diode includes a substrate, a light-emitting epitaxial layer, a first electrode, a second electrode and a passivation layer.

The substrate has a patterned surface formed with a protrusion unit, the patterned surface having a first patterned portion and a second patterned portion. The protrusion unit includes a plurality of first protrusions formed on the first patterned portion and a plurality of second protrusions formed on the second patterned portion. The light-emitting epitaxial layer is disposed on the substrate.

The light-emitting epitaxial layer includes a first semiconductor layer, a second semiconductor layer and an active layer. The first semiconductor layer is disposed on the second patterned portion of the substrate to expose the first patterned portion. The active layer is interposed between the first semiconductor layer and the second semiconductor layer.

The first electrode is connected to the first semiconductor layer. The second electrode is connected to the second semiconductor layer.

The passivation layer has an epitaxial-covering portion disposed on the light-emitting epitaxial layer, and a substrate-covering portion at least partially covering the first patterned portion of the substrate. The substrate-covering portion of the passivation layer has a top surface that is formed with hillocks. At least one of the hillocks having a height lower than that of at least one of the second protrusions formed on the second patterned portion of the substrate.

According to another aspect of the disclosure, a high-voltage flip-chip light-emitting device includes at least two of flip-chip light-emitting diodes and at least one metal bridge that interconnects any two adjacent ones of the flip-chip light-emitting diodes.

Each of the flip-chip light-emitting diode includes a substrate, a light-emitting epitaxial layer, a first electrode, a second electrode and a passivation layer.

The substrate has a patterned surface formed with a protrusion unit, the patterned surface having a first patterned portion and a second patterned portion. The protrusion unit includes a plurality of first protrusions formed on the first patterned portion and a plurality of second protrusions formed on the second patterned portion. The light-emitting epitaxial layer is disposed on the substrate.

The light-emitting epitaxial layer includes a first semiconductor layer disposed on the second patterned portion of the substrate to expose the first patterned portion, a second semiconductor layer, and an active layer interposed between the first semiconductor layer and the second semiconductor layer.

The first electrode is connected to the first semiconductor layer. The second electrode is connected to the second semiconductor layer.

The passivation layer has an epitaxial-covering portion disposed on the light-emitting epitaxial layer, and a substrate-covering portion at least partially covering the first patterned portion of the substrate.

The metal bridge has a top surface that is formed with undulations, and at least one of the undulations has an undulation height of less than 1.5 μm.

BRIEF DESCRIPTION OF THE DRAWINGS

Other features and advantages of the disclosure will become apparent in the following detailed description of the embodiments with reference to the accompanying drawings, of which.

DETAILED DESCRIPTION

Figure 1:
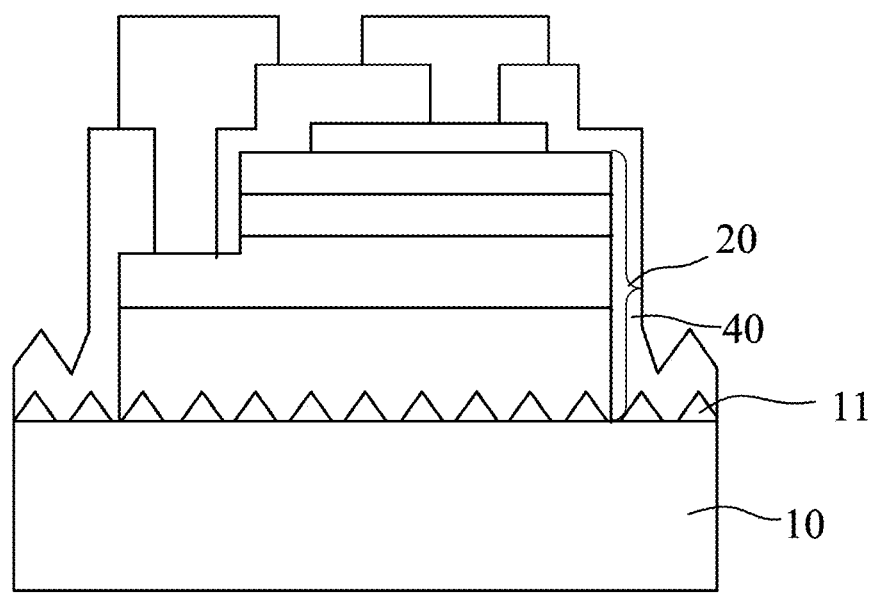
FIG. 1 is a schematic view illustrating a conventional flip-chip light-emitting diode (LED)
Figure 2:
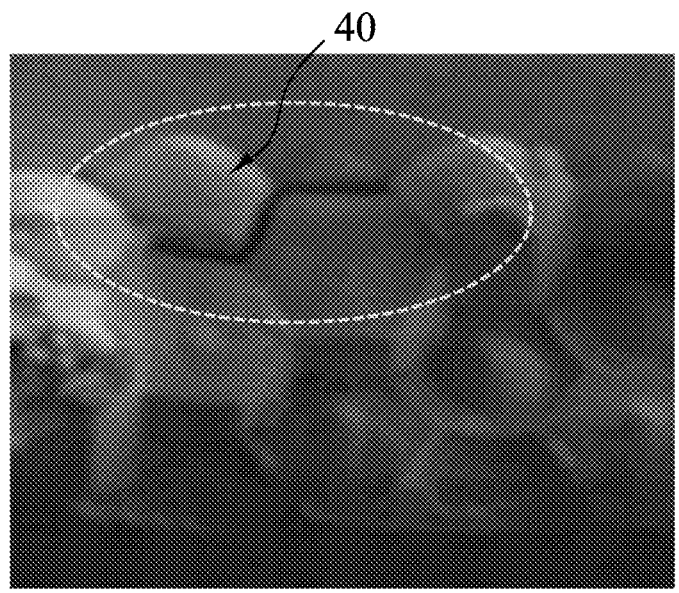
FIG. 2 is an image of a top view of a passivation layer disposed on a patterned substrate of the conventional flip-chip LED.

Before the disclosure is described in greater detail, it should be noted that where considered appropriate, reference numerals or terminal portions of reference numerals have been repeated among the figures to indicate corresponding or analogous elements, which may optionally have similar characteristics.

Embodiment 1

Figure 3:
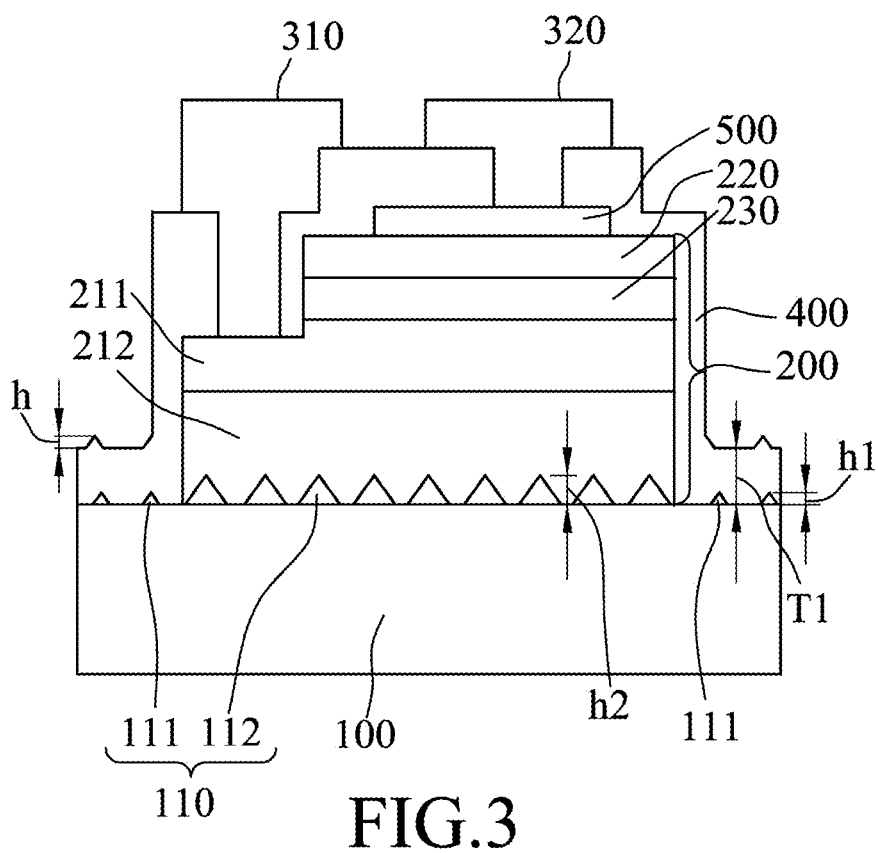
FIG. 3 is a schematic view illustrating a first embodiment of a flip-chip LED in accordance with the disclosure.

Referring to FIG. 3, a first embodiment of a flip-chip light-emitting diode (LED) in accordance with the disclosure is a mini LED that has a length of a single side not larger than 250 μm. In other embodiments, the flip-chip LED has a length or width ranging from 100 μm to 500 μm and a thickness ranging from 100 μm to 200 μm. In other embodiments, the flip-chip LED may be a micro LED die that has a length ranging from 2 μm to 100 μm, a width ranging from 2 μm to 100 μm and a thickness ranging from 2 μm to 100 μm.

In this embodiment, the flip-chip LED includes a substrate 100, a light-emitting epitaxial layer 200 disposed on the substrate 100, a first electrode 310, a second electrode 320 and a passivation layer 400.

The substrate 100 has a patterned surface formed with a protrusion unit 110. The patterned surface has a first patterned portion and a second patterned portion.

The light-emitting epitaxial layer 200 includes a first semiconductor layer 211, a second semiconductor layer 220 and an active layer 230. The first semiconductor layer 211 is disposed on the second patterned portion of the substrate 100 to expose the first patterned portion. The active layer 230 is interposed between the first semiconductor layer 211 and the second semiconductor layer 220.

The first electrode 310 is connected to the first semiconductor layer 211. The second electrode 320 is connected to the second semiconductor layer 220.

The passivation layer 400 has an epitaxial-covering portion disposed on the light-emitting epitaxial layer 200 and a substrate-covering portion at least partially covering the first patterned portion of the substrate 100. The substrate-covering portion of the passivation layer 400 has a top surface that is formed with hillocks. In other embodiments, the epitaxial-covering portion wraps around the light-emitting epitaxial layer 200.

The substrate 100 is made of a material selected from sapphire ($Al_2O_3$), silicon, silicon carbide, gallium arsenide, but is not limited thereto. In this embodiment, the substrate is made of sapphire. The patterned surface of the substrate 100 may alleviate an adverse impact of lattice mismatch on the growth of the light-emitting epitaxial layer 200 and facilitate light extraction efficiency from a side surface of the flip-chip LED.

The protrusion unit 110 of the substrate 100 includes a plurality of first protrusions 111 formed on the first patterned portion and a plurality of second protrusions 112 formed on the second patterned portion. The second protrusions 112 have an average height greater than 0 µm so that growth direction of line defects (i.e., dislocations) in the light-emitting epitaxial layer 200 is different from a normal vector of a lattice plane of the light-emitting epitaxial layer 200, which alleviates propagation of dislocations and reduces an adverse effect on the growth of the light-emitting epitaxial layer 200 caused by lattice mismatch with the substrate 100. Consequently, the light-emitting epitaxial layer 200 is conferred with a region with lower defect density that is useful for forming the active layer 230 so as to improve characteristics of the flip-chip LED.

The protrusion unit 110 may be formed by imprinting, dry etching or wet etching. Each of the first protrusions 111 and the second protrusions 112 of the protrusion unit 110 has a shape independently selected from a cone, a triangular pyramid, a hexagonal pyramid, a cone-like shape, a triangular pyramid-like shape, and a hexagonal pyramid-like shape. The shapes and sizes of the first protrusions 111 and the second protrusions 112 of the protrusion unit 110 are adjustable so as to improve the light extraction efficiency of the flip-chip LED.

In this embodiment, the light-emitting epitaxial layer 200 is made of a material selected from group III nitride-based compound semiconductors (e.g., gallium nitride-based compound semiconductors) and is formed by metal-organic chemical vapor deposition. In some embodiments, the light-emitting epitaxial layer 200 may be disposed on a heat dissipation substrate by flip-chip technology.

In this embodiment, the first semiconductor layer 211 is an n-type semiconductor layer where electrons are major carriers. In some embodiments, the light-emitting epitaxial layer 200 further includes a buffer layer 212 that is interposed between the first semiconductor layer 211 (i.e., the n-type semiconductor layer) and the substrate 100. The buffer layer 212 is able to relieve stress caused by lattice mismatch between the first semiconductor layer 211 and the substrate 100, and thus improves the quality of epitaxial growth of the first semiconductor layer 211 without adversely affecting the operation of the flip-chip LED.

In this embodiment, the second semiconductor layer 220 is a p-type semiconductor layer where holes are major carriers. In some embodiments, compositions of the first semiconductor layer 211 and the second semiconductor layer 220 may be swapped, and that is, the first semiconductor layer 211 is a p-type semiconductor layer and the second semiconductor layer 220 is an n-type semiconductor layer.

In this embodiment, the active layer 230 is formed with a multi-quantum-well structure in order to increase frequency of electron-hole collision, and thus facilitates electron-hole recombination by confining electrons and holes therein, thereby improving internal quantum efficiency.

An ohmic contact is formed at a junction between the first electrode 310 and the first semiconductor layer 211, and at a junction between the second electrode 320 and the second semiconductor layer 220.

The flip-chip LED further includes a current spreading layer 500 that is interposed between the second semiconductor layer 220 and the second electrode 320 in order to spread a current into the second semiconductor layer 220 from the second electrode 320 and to allow a more uniform distribution of a current density in the second semiconductor layer 220. In this embodiment, the current spreading layer 500 is made of indium tin oxide (ITO), but is not limited thereto. When a voltage is applied across the first electrode 310 and the second electrode 320, a current flows from the second electrode 320 to the first electrode 310 through the light-emitting epitaxial layer 200, such that the current is laterally distributed over the light-emitting epitaxial layer 200.

Under an electric field, the electrons from the first semiconductor layer 211 (i.e., the n-type semiconductor layer) and the holes from the second semiconductor layer 220 (i.e., the p-type semiconductor layer) recombine in the multi-quantum-well structure of the active layer 230 of the light-emitting epitaxial layer 200, and energy generated by electron-hole recombination emerges as photons of light. A wavelength of the emitted light is determined by selection of materials and control of process conditions of epitaxial growth of the active layer 230. In this embodiment, the active layer 230 is made of gallium nitride-based compound semiconductors, thus the flip-chip LED in accordance with this embodiment is configured to emit blue light.

In this embodiment, the flip-chip LED is designed to emit light from a backside of the substrate 100, and the first electrode 310 and the second electrode 320 are configured at the same side of the flip-chip LED. Hence, the first electrode 310 is disposed on an upper surface of the first semiconductor layer 211 to prevent the emitted light from being blocked. The upper surface of the first semiconductor layer 211 for disposing the first electrode 310 is formed by etching away portion of the light-emitting epitaxial layer 200 and then stopping at the first semiconductor layer 211, so as to form a platform or a recess that is spaced apart from the active layer 230.

The first electrode 310 (i.e., an n-type electrode) tends to have an area as small as possible such that the active layer 230 would have a large effective area for emitting light, under the premise of maintaining a low contact resistance between the first electrode 310 and the first semiconductor layer 211 and in consideration of current distribution in the light-emitting epitaxial layer 200. Besides, in view of a packaging process of the flip-chip LED, where the flip-chip LED chip is flipped and then is assembled on a printed circuit board or a submount through two bonding pads using flip-chip die bonding to form an optoelectronic device, the bonding pads are required to have a sufficient area to guarantee a mechanical strength and reliability. However, one of the bonding pads is electrically connected to the first electrode 310, the size requirement of the bonding pads may be contrary to the requirement of reducing the area of the first electrode 310. Hence, the size of the first electrode 310 is as small as possible such that the flip-chip LED is provided with an effective light-emitting area to ensure an effective bonding area of the bonding pads, as well as to minimize the spacing between the first electrode 310 and the second electrode 320.

The second electrode 320 is made of a material selected from a high reflectance material such as silver. The light emitted from the active layer 230 partially irradiates outside through the substrate 100, and a remainder of the light is reflected by the second electrode 320 and then irradiates outside.

The passivation layer 400 has the substrate-covering portion and the epitaxial-covering portion to protect the flip-chip LED effectively. In a wafer including a plurality of the flip-chip LEDs, the substrate-covering portion of the passivation layer 400, which is at least partially covering the first patterned portion of the substrate 100, serves as an isolation layer to separate any two adjacent ones of the flip-chip LEDs. In some embodiments, the substrate-covering portion of the passivation layer 400 completely covers the first patterned portion of the substrate 100. The first patterned portion of the substrate 100 is exposed at the end of formation of an isolation trench, that is, a portion of the light-emitting epitaxial layer 200 is etched away until the first patterned portion of the substrate 100 at the outer periphery of the flip-chip LED is exposed, thereby reducing difficulty of wafer dicing in a mini LED. The epitaxial-covering portion of the passivation layer 400, which is disposed on the light-emitting epitaxial layer 200, covers a side surface of the light-emitting epitaxial layer 200 that is exposed during the formation of the isolation trench, and an upper surface of the light-emitting epitaxial layer 200. The passivation layer 400 further has openings for receiving and exposing the first electrode 310 and the second electrode 320 for a flip-chip die bonding process to be subsequently performed.

Since thne flip-chip LED is the mini LED, each of the first electrode 310 and the second electrode 320 further has an extension portion that extends along the passivation layer 400 to partially and laterally cover the passivation layer 400, so that a minimum area is provided for the packaging process to be subsequently performed.

The passivation layer 400 surrounding the first electrode 310 and the second electrode 320 prevents the flip-chip LED from being damaged by electrostatic discharge, and thus improves the reliability of the flip-chip LED. Static electricity accumulated at a surface of the flip-chip LED may create an electric field at the passivation layer 400 between the first electrode 310 and the second electrode 320. Breakdown voltage of the passivation layer 400 determines the electrostatic discharge tolerance of the flip-chip LED. Besides, the passivation layer 400 disposed on the light-emitting epitaxial layer 200 can prevent a short circuit that may be generated between the first semiconductor layer 211 and the second semiconductor layer 220 via a leak of a conductive material, e.g., a solder paste. In addition, when the flip-chip LED of the mini LED is operated under a high current density, the passivation layer 400 can avoid current leakage around the light-emitting epitaxial layer 200.

In order to solve the aforesaid issues, the passivation layer 400 may be made of an insulating material which has a high dielectric constant, and which is selected from silicon dioxide, silicon nitride, titanium oxide, tantalum oxide, niobium oxide, barium titanate, and combinations thereof. The passivation layer 400 may be formed as a distributed Bragg reflector (DBR). The passivation layer 400 may be formed by plasma enhanced chemical vapor deposition, vacuum evaporation deposition, or sputter deposition.

For complying with the miniaturization requirement of a chip size, the passivation layer 400 has a thinner thickness in consideration of heat dissipation issue that may occur due to higher current density in the mini LED in comparison to the conventionally-sized LED. In some embodiments, the substrate-covering portion of the passivation layer 400 has a first thickness (T1) ranging from 0.5 µm to 5 µm. In this embodiment, the first thickness (T1) of the substrate-covering portion of the passivation layer 400 is 2 µm to avoid breakage of the passivation layer 400 caused by poor film deposition on the first patterned portion of the substrate 100 or improper operation of push-up needles during a die bonding process to be subsequently performed. The breakage of the passivation layer 400 may result in a short circuit between the first and second electrodes 310, 320 in a eutectic form and the second semiconductor layer 220.

In the conventional LED, a passivation layer formed by chemical vapor deposition or physical vapor deposition has a poor adhesion with electrodes or other components due to its patterned surface conforming with the patterned sapphire substrate and tendency to have cracks or pinholes.

Therefore, in order to improve the quality of the passivation layer 400, the first protrusions 111 formed on the first patterned portion of the substrate 100 is scaled down to reduce an impact of roughness of the passivation layer 400 thus deposited. In some embodiments, at least one of the hillocks of the top surface of the substrate-covering portion of the passivation layer 400 has a height lower than that of at least one of the second protrusions 112 formed on the second patterned portion of the substrate 100.

In this embodiment, the substrate 100 has a plurality of the first protrusions 111 and a plurality of the second protrusions 112, where the first protrusions 111 have an average height lower than those of the second protrusions 112.

The first protrusions 111 formed on the first patterned portion have a first average height (h1), and the second protrusions 112 formed on the second patterned portion have a second average height (h2). The hillocks of the top surface of the substrate-covering portion of the passivation layer 400 have a hillock average height (h) that is lower than the second average height (h2).

In this embodiment, the first average height (h1) is lower than the second average height (h2). In some embodiments, a ratio of the first average height (h1) to the second average height (h2) ranges from 1:10 to 1:2. In some embodiments, a ratio of the second average height (h2) to the hillock average height (h) is larger than 3.

For example, the first average height (h1) is larger than 0 µm and no larger than 1 µm. The second average height (h2) ranges from 2 µm to 2.5 µm. The hillock average height (h) is larger than 0 µm and less than 1.5 µm. In certain embodiments, the hillock average height (h) is larger than 0 µm and less than 1 µm. In an example, the hillock average height (h) is 0.68 µm with a measurement error of 0.05 µm. In certain embodiments, the hillock average height (h) is larger than 0 µm and less than 0.5 µm.

The first protrusions 111 may be scaled down by wet etching or dry etching that includes inductively coupled plasma etching.

The first thickness (T1) of the substrate-covering portion of the passivation layer 400 is correlated to the first average height (h1) of the first protrusions 111 of the substrate 100. Hence, scaling down of the first protrusions 111 may make the passivation layer 400 smoothly transits between any two adjacent ones of the first protrusions 111 and would have less cracks or pinholes. Scaling down of the first protrusions 111 also permits the substrate 100 to have a lower adhesion to metallic residues and dirt, and thus lowers the risk of a short circuit. However, the quality of the light-emitting epitaxial layer 200, which is determined by the second protrusions 112, is not influenced by scaling down of the first protrusions 111.

Figure 4:
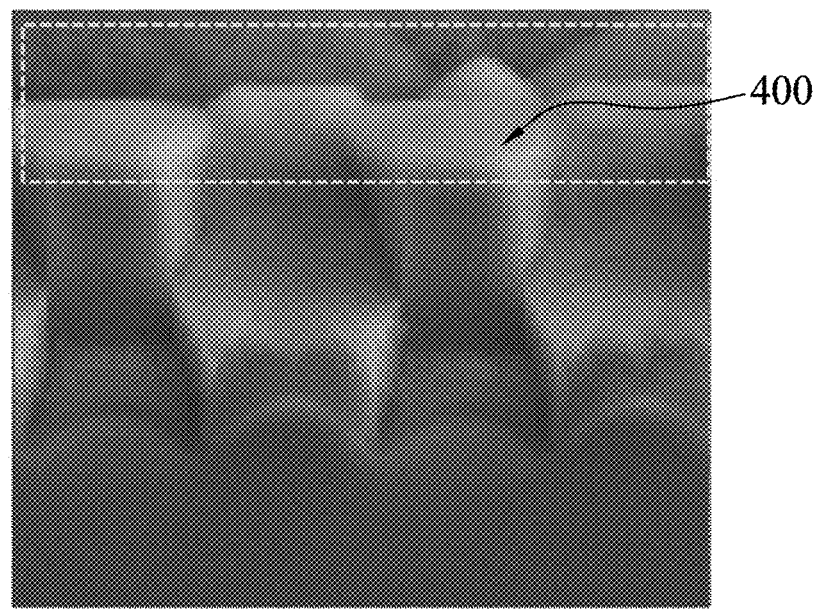
FIG. 4 is an image of a top view of a substrate-covering portion of a passivation layer of the first embodiment of the disclosure.

Referring to FIG. 4, the passivation layer 400 of the first embodiment is shown to have a smooth and continuous surface without cracks or pinholes, covers the substrate 100 well, and is disposed on the light-emitting epitaxial layer 200. The configuration of the passivation layer 400 is beneficial to subsequent wafer dicing process which forms a plurality of the flip-chip LEDs when a wafer including the flip-chip LEDs in used, resin molding and encapsulation, so as to form various types of final products including surface-mounted LEDs, LED backlight modules, etc.

Embodiment 2

Figure 5:
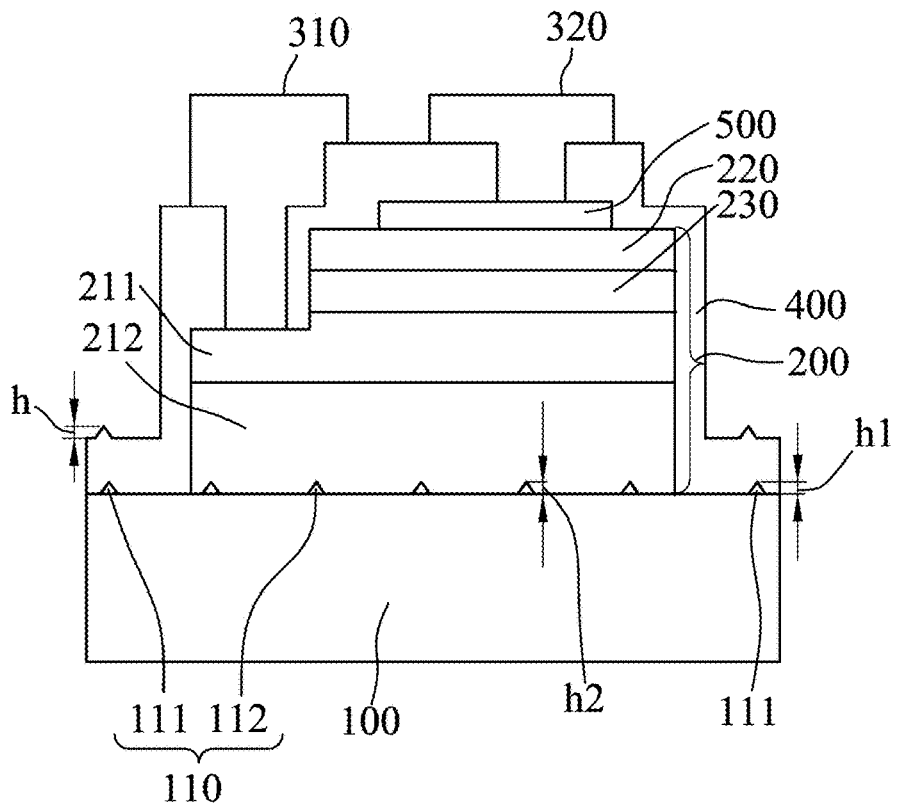
FIG. 5 is a schematic view illustrating a second embodiment of the flip-chip LED in accordance with of the disclosure.

Referring to FIG. 5, a second embodiment of the flip-chip LED is similar to the first embodiment of the flip-chip LED.

However, the first protrusions 111 of the first patterned portion and the second protrusions 112 of the second pattered portion are scaled down. Any two adjacent ones of the first protrusions 111 have a first spacing (sp1) and any two adjacent ones of the second protrusions 112 have a second spacing (sp2). Both of the first spacing (sp1) and the second spacing (sp2) are greater than that of the first embodiment. Preferably, the first spacing (sp1) and the second spacing (sp2) are not smaller than 2 μm.

In this embodiment, both of the first average height (h1) of the first protrusions 111 and the second average height (h2) of the second protrusions 112 range from 1 μm to 2 μm. The hillock average height (h) is lower than the second average height (h2).

The substrate 100 of the flip-chip LED in this embodiment is manufactured at the substrate-preparing step similar to the second embodiment. First, the substrate 100 is manufactured by adjusting a geometric pattern of a photomask and an etching time during photolithography, so as to obtain the first protrusions 111 and the second protrusions 112 with desired size and distribution.

In this embodiment, distribution of the first protrusions 111 is lower, so that the passivation layer 400 smoothly transits between the first protrusions 111. The top surface of the passivation layer 400 is more continuous and has smaller hillocks. Besides, a stress concentration region at the first patterned portion of the substrate 100 is diminished as well. Moreover, in this embodiment, even if the second protrusions 112 are scaled down to the second average height (h2) ranging from 1 μm to 2 μm, the quality of the light-emitting epitaxial layer 200 is still guaranteed by the second protrusions 112, so as to lessen defects formation, lower current leakage and increase the internal quantum efficiency.

Embodiment 3

Figure 6:
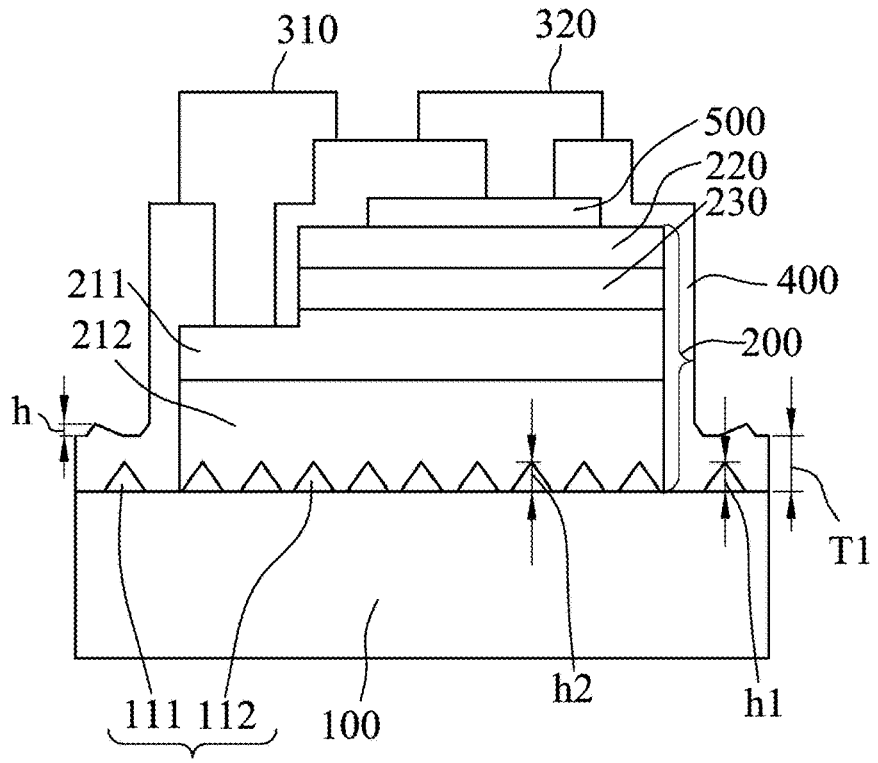
FIG. 6 is a schematic view illustrating a third embodiment of the flip-chip LED in accordance with of the disclosure.

Referring to FIG. 6, a third embodiment of the flip-chip LED is similar to the first embodiment of the flip-chip LED. However, the first protrusions 111 of the first patterned portion and the second protrusions 112 of the second pattered portion have the same height, while distribution of the first protrusions 111 is lower than that of the second protrusions 112.

In this embodiment, the first spacing (sp1) of any two adjacent ones of the first protrusions 111 as described in the second embodiment is not smaller than 2 μm, and the second spacing (sp2) of any two adjacent ones of the second protrusions 112 as described in the second embodiment is not larger than 3 μm. A ratio of a surface density of the first protrusions 111 to a surface density of the second protrusions 112 ranges from 1:10 to 1:2, where a surface density is defined as an amount of protrusions per unit area.

In a preferred example, the first thickness (T1) of the passivation layer 400 of the flip-chip LED is 2 μm, the first spacing (sp1) of any two adjacent ones of the first protrusions 111 is 8 μm, and the second spacing (sp2) of any two adjacent ones of the second protrusions 112 is 2 μm. The first average height (h1) of the first protrusions 111 ranges from 2 μm to 2.5 μm, and the second average height (h2) of the second protrusions 112 ranges from 2 μm to 2.5 μm.

In this embodiment, the quality of the light-emitting epitaxial layer 200 likewise is guaranteed by the second protrusions 112. Due to the higher spacing (sp1) of the first protrusions 111, the substrate-covering portion of the passivation layer 400 is continuous without cracks, so that an isolation between two adjacent ones of the flip-chip LEDs in the wafer is guaranteed. Moreover, the advantages of this embodiment are that the first and second protrusions 111 and 112 of the substrate 100 may have a conventional height (i.e., 2 μm to 2.5 μm) for better growth of the light-emitting epitaxial layer 200, and that the first spacing (sp1) and the second spacing (sp2) are expanded to maintain the completeness of the passivation layer 400 for providing good insulation effect.

Figure 7:
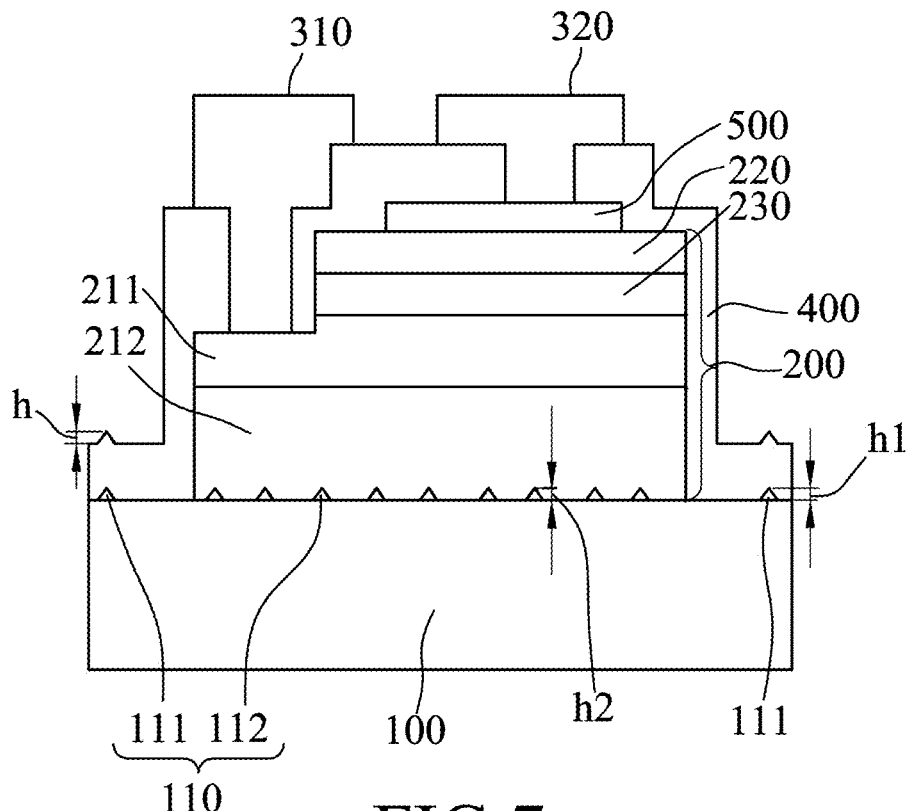
FIG. 7 is a schematic view illustrating a variation of the third embodiment.

Referring to FIG. 7, a first variation of the third embodiment is shown. The first protrusions 111 of the first patterned portion and the second protrusions 112 of the second pattered portion of the substrate 100 are scaled down to have an average height lower than that of the third embodiment, and distribution of the first protrusions 111 is lower than that of the second protrusions 112.

In this embodiment, the first average height (h1) of the first protrusions 111 ranges from 1 μm to 2 μm, and the second average height (h2) of the second protrusions 112 ranges from 1 μm to 2 μm. The first spacing (sp1) of any two adjacent ones of the first protrusions 111 is not smaller than 2 μm, and the second spacing (sp2) of any two adjacent ones of the second protrusions 112 is not larger than 3 μm.

The substrate 100 in this variation of the third embodiment is manufactured by patterning the substrate 100 to form the first protrusions 111 and the second protrusions 112 having the abovementioned average height respectively, and removing some of the first protrusions 111 formed on the first patterned portion of the substrate 100 after the formation of the isolation trench, so as to lower a distribution of the first protrusions 111. In this variation, an etching time required to remove some of the first protrusions 111 is shorter than that of the third embodiment as shown in FIG. 6, due to smaller size of the first protrusions 111.

In a second variant of the third embodiment, the first protrusions 111 of the first patterned portion have an average height lower than that of the second protrusions 112 of the second patterned portion, and distribution of the first protrusions 111 is lower than that of the second protrusions 112.

In this variant, the first average height (h1) of the first protrusions 111 ranges from 1 μm to 2 μm, and the second average height (h2) of the second protrusions 112 ranges from 2 μm to 2.5 μm. The first spacing (sp1) of any two adjacent ones of the first protrusions 111 is not smaller than 2 μm, and the second spacing (sp2) of any two adjacent ones of the second protrusions 112 is not larger than 3 μm.

Embodiment 4

Figure 8:
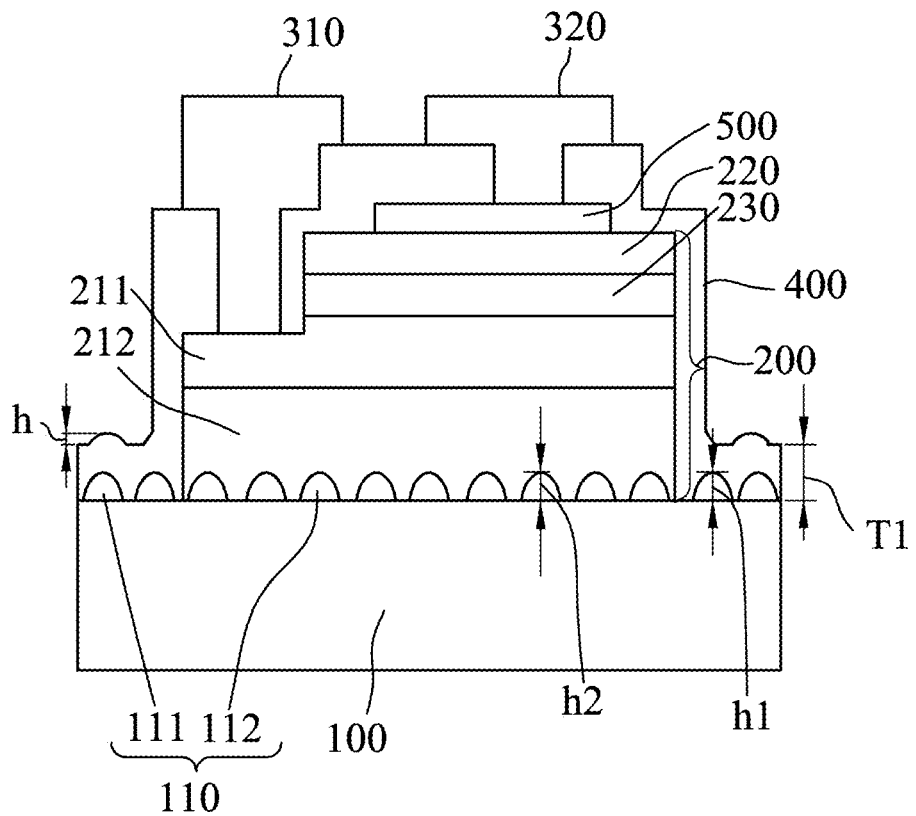
FIG. 8 is a schematic view illustrating a fourth embodiment of the flip-chip LED in accordance with of the disclosure.

Referring to FIG. 8, a fourth embodiment of the flip-chip LED is similar to the first embodiment of the flip-chip LED except that portions of the first protrusions 111 and the second protrusions 112 have an upper part modified as a smooth surface.

In this embodiment, the first average height (h1) of the first protrusions 111 ranges from 2 μm to 2.5 μm, and the second average height (h2) of the second protrusions 112 ranges from 2 μm to 2.5 μm. The upper parts of the first protrusions 111 and the second protrusions 112 are partially formed in a shape of a hemisphere or a platform. A ratio of the first average height (h1) of the first protrusions 111 to the first thickness (T1) of the substrate-covering portion of the passivation layer 400 is larger than 0.5.

Since the upper parts of the first protrusions 111 are partially formed with the smooth surface, the substrate-covering portion of the passivation layer 400 is continuous without cracks, so that an isolation between two adjacent ones of the flip-chip LEDs in the wafer is guaranteed. Moreover, since the first and second protrusions 111 and 112 of the substrate 100 have a conventional height (i.e., 2 μm to 2.5 μm), better growth of the light-emitting epitaxial layer 200 can be achieved, and since the upper parts of the first protrusions 111 are partially formed with the smooth surface, the passivation layer 400 is continuously formed without cracks, so as to provide good insulation.

Embodiment 5

Figure 9:
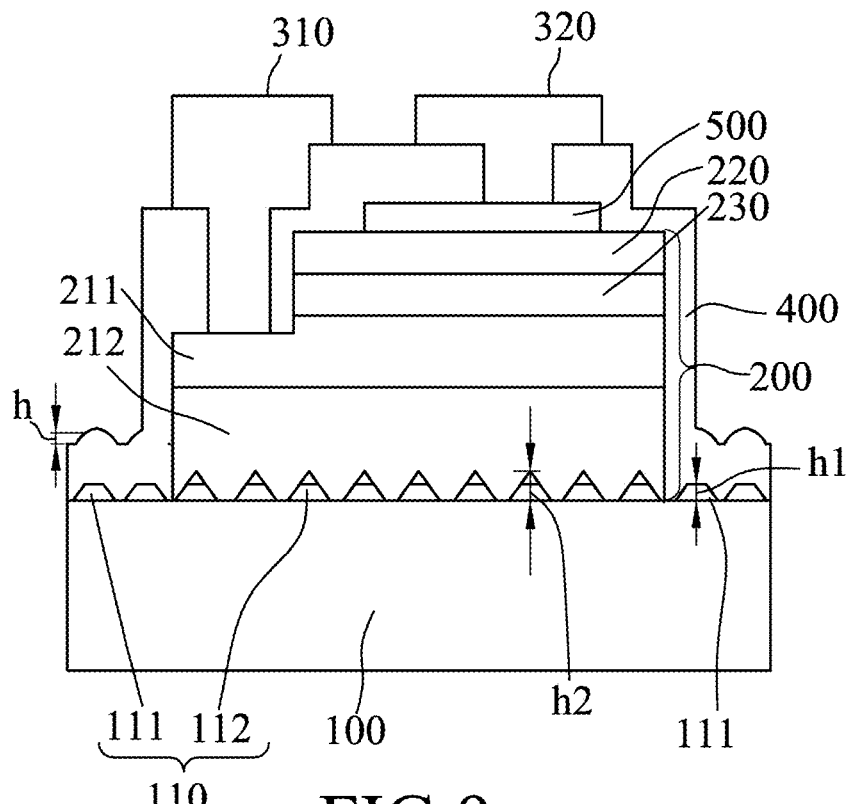
FIGS. 9 to 10 are schematic views illustrating a fifth embodiment of the flip-chip LED in accordance with the disclosure.
Figure 10:
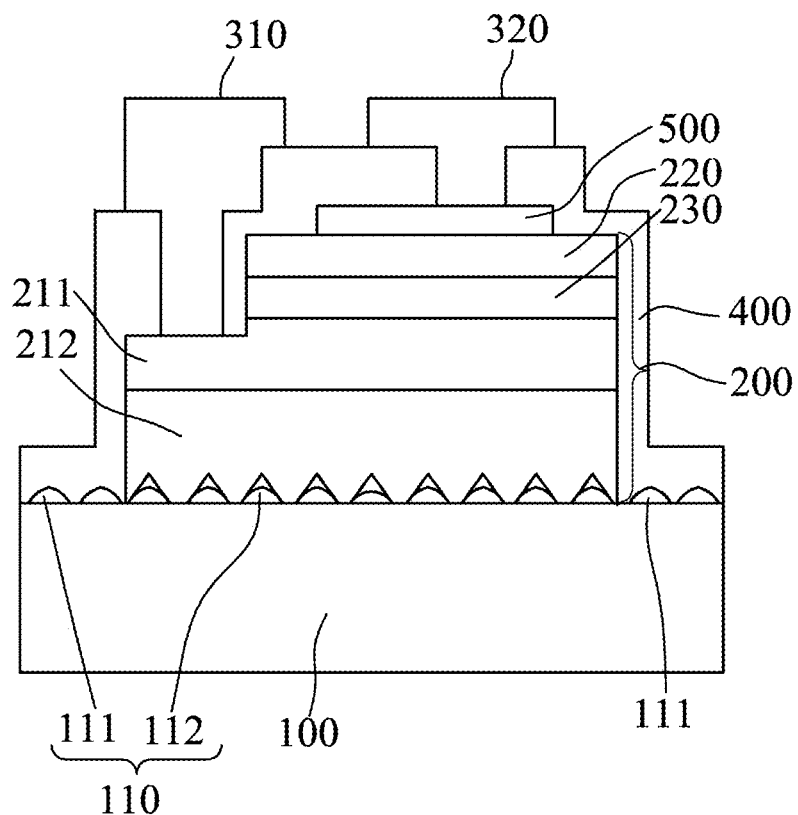
Figure 11:
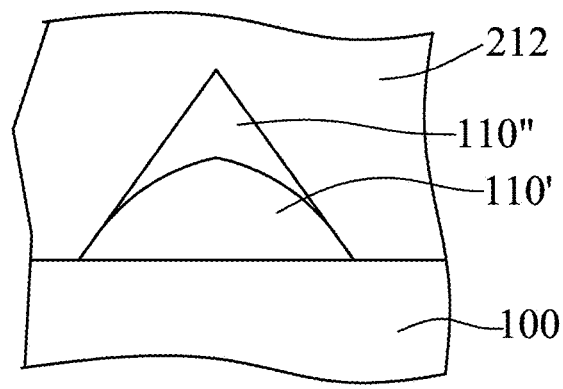
FIGS. 11 to 12 are schematic views illustrating variations of the fifth embodiment.

Referring to FIGS. 9 to 11, a fifth embodiment of the flip-chip LED is similar to the first embodiment of the flip-chip LED. However, each of the first protrusions 111 has a first part 110' having a smooth top surface, and each of the second protrusions 112 has the first part 110' and a removable second part 110" disposed on the first part 110'.

Referring to FIG. 11, the first part 110' of each of the second protrusions 112 is disposed on the substrate 100, and the second part 110" is disposed on the first part 110' opposite to the substrate 100. The second part 110" serves as a sacrificial layer, which is more removable than the first part 110'.

Each of the first protrusions 111 having the first part 110' may be shaped into a hemisphere, a platform, a cone, a triangular pyramid, a hexagonal pyramid, a cone-like shape, a triangular pyramid-like shape, and a hexagonal pyramid-like shape. Each of the second protrusions 112 having the first part 110' and the second part 110" may be shaped into a hemisphere, a platform, a cone, a triangular pyramid, a hexagonal pyramid, a cone-like shape, a triangular pyramid-like shape, and a hexagonal pyramid-like shape.

In this embodiment, the substrate 100 of the flip-chip LED is manufactured by first patterning the substrate 100 with the first protrusions 111 and the second protrusions 112, each of the first protrusions 111 and the second protrusions 112 having the first part 110' and the second part 110", and then removing the second part 110" of the first protrusions 111 formed on the first patterned portion of the substrate 100 after the formation of the isolation trench, so as to obtain the first protrusions 111 with a reduced size.

The first part 110' is made of a material that may be the same as that of the substrate 100, for example, sapphire. The second part 110" is made of a removable material including silicon dioxide and aluminum nitride. Aluminum nitride is less removable than silicon dioxide but has a lattice constant similar to that of the light-emitting epitaxial layer 200 which is made of gallium nitride. Hence, less lattice mismatching between aluminum nitride and gallium nitride-based semiconductors is beneficial to the quality of epitaxial growth of the light-emitting epitaxial layer 200.

The advantage of this embodiment is that the shape of each of the first protrusions 111 is adjustable to meet the shape that is suitable for deposition of the passivation layer 400 under the premise of maintaining the quality of the light-emitting epitaxial layer 200 that is determined by the second protrusions 112.

Figure 12:
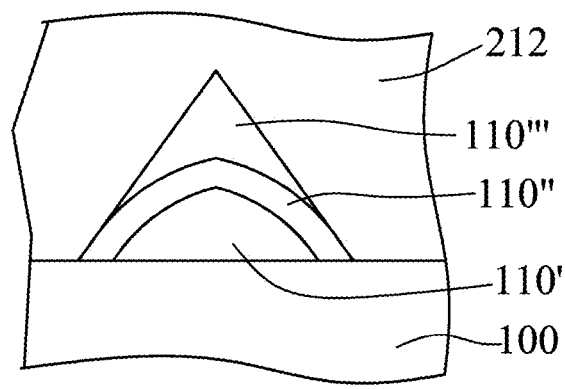

Referring to FIG. 12, a variation of the fifth embodiment of the flip-chip LED is similar to the sixth embodiment except that each of the second protrusions 112 further has a third part 110''' disposed on the second part 110".

The second part 110" serves as a sacrificial layer and is more removable than the first part 110' and/or the third part 110'''. The third part 110''' serves as a nucleation layer and is more suitable for epitaxial growth of the light-emitting epitaxial layer 200 than the second part 110".

In this variation of the fifth embodiment, the first part 110' is made of sapphire, the second part 110" is made of silicon dioxide, and the third part 110''' is made of aluminum nitride.

The substrate 100 of the flip-chip LED in this variation is manufactured by patterning the substrate 100 with the first protrusions 111 and the second protrusions 112, each of the first protrusions 111 and the second protrusions 112 having the first part 110', the second part 110" and the third part 110''', and then removing the second part 110" and the third part 110''' of each of the first protrusions 111 after the formation of the isolation trench, so as to obtain the first protrusions 111 with reduced size for deposition of the passivation layer 400 to be subsequently performed.

The advantage of this variation is that the quality of the light-emitting epitaxial layer 200 is further improved by the third parts 110''' of the second protrusions 112.

Embodiment 6

Figure 13:
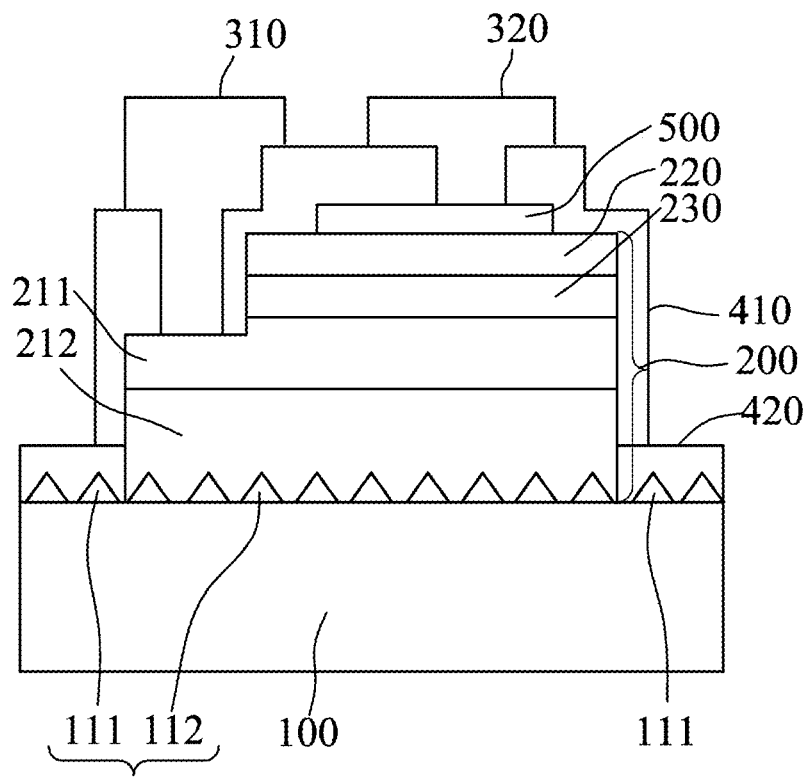
FIGS. 13 to 14 are schematic views illustrating a sixth embodiment of the flip-chip LED in accordance with the disclosure.

Referring to FIG. 13, a sixth embodiment of the flip-chip LED is similar to the first embodiment of the flip-chip LED except that the substrate-covering portion of the passivation layer 400 is made of a flexible insulating material. The ductility of the flexible insulating material can alleviate cracks of the substrate-covering portion of the passivation layer 400 that initiates from the stress concentration region at the first patterned portion of the substrate 100.

The passivation layer 400 of the flip-chip LED in this embodiment is manufactured by filling the flexible insulating material into the isolation trench. The formation of the passivation layer 400 is carried out at a temperature higher than the glass transition temperature of the flexible insulating material.

The flexible insulating material may not be the only material used for making the passivation layer 400 in consideration of the characteristics of the same. Hence, in some embodiments, the passivation layer 400 includes a first passivation layer 410 and a second passivation layer 420. The second passivation layer 420 covers the first patterned portion of the substrate 100, and the first passivation layer 410 is disposed on the second passivation layer 420 and the light-emitting epitaxial layer 200. In other embodiments, the first passivation layer 410 is disposed on the second passivation layer 420 and wraps around the light-emitting epitaxial layer 200. The first passivation layer 410 is made of a material selected from silicon dioxide, silicon nitride, titanium oxide, tantalum oxide, niobium oxide, barium titanate, and combinations thereof. The second passivation layer 420 is made of a flexible insulating material selected from photoresists, insulating plastic materials including a thermosetting polymer, which can prevent a failure of the passivation layer 400 during a packaging process to be subsequently performed. The thermosetting polymers include epoxy, thermosetting polyimide, parylene (e.g., parylene N, parylene C, parylene D, parylene HT), polybenzoxazole (PBO), and combinations thereof.

Figure 14:
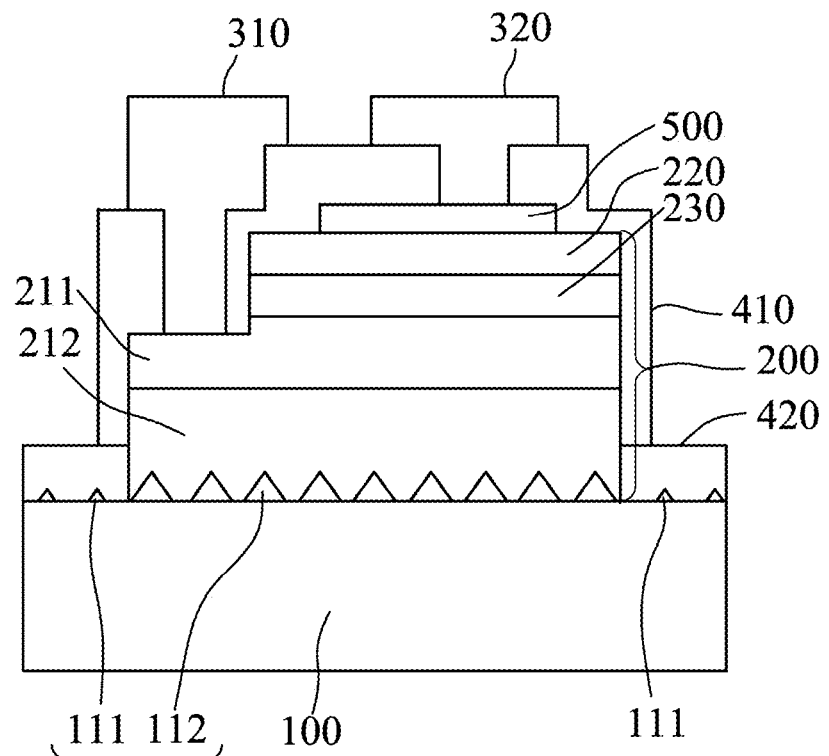

It should be noted that, the passivation layer 400 of the sixth embodiment can be further combined with any one of the substrate 100 of the first embodiment to the fifth embodiment, and combinations thereof. For example, as shown in FIG. 14, the passivation layer 400 of the sixth embodiment is combined with the substrate 100 of the first embodiment.

In the case that the passivation layer 400 of the sixth embodiment is combined with one of the substrate 100 of the first embodiment and the second embodiment, the first protrusions 111 of the substrate 100 have a reduced average height, so that the smooth and continuous surface of the passivation layer 400 can be obtained by a relatively thinner flexible insulating material.

In the case that the passivation layer 400 of the sixth embodiment is combined with the substrate 100 of the third embodiment, the distribution of the first protrusions 111 of the substrate 100 is lower, so that the stress concentration region at the spacing between any two adjacent ones of the first protrusions 111 is further alleviated in the second passivation layer 420.

In the case that the passivation layer 400 of the sixth embodiment is combined with one of the substrate 100 of the fourth and fifth embodiments, the first protrusions 111 of the substrate 100 have a reduced size and a smooth top surface made by an optimized etching condition, so that the stress concentration region at peaks of the first protrusions 111 is further alleviated in the second passivation layer 420. Moreover, the epitaxial-covering portion and the substrate-covering portion of the passivation layer 400 are continuous without cracks, and the quality of the light-emitting epitaxial layer 200 is guaranteed as well by introducing the sacrificial layer of the second part 110" of each of the second protrusions 112.

Figure 15:
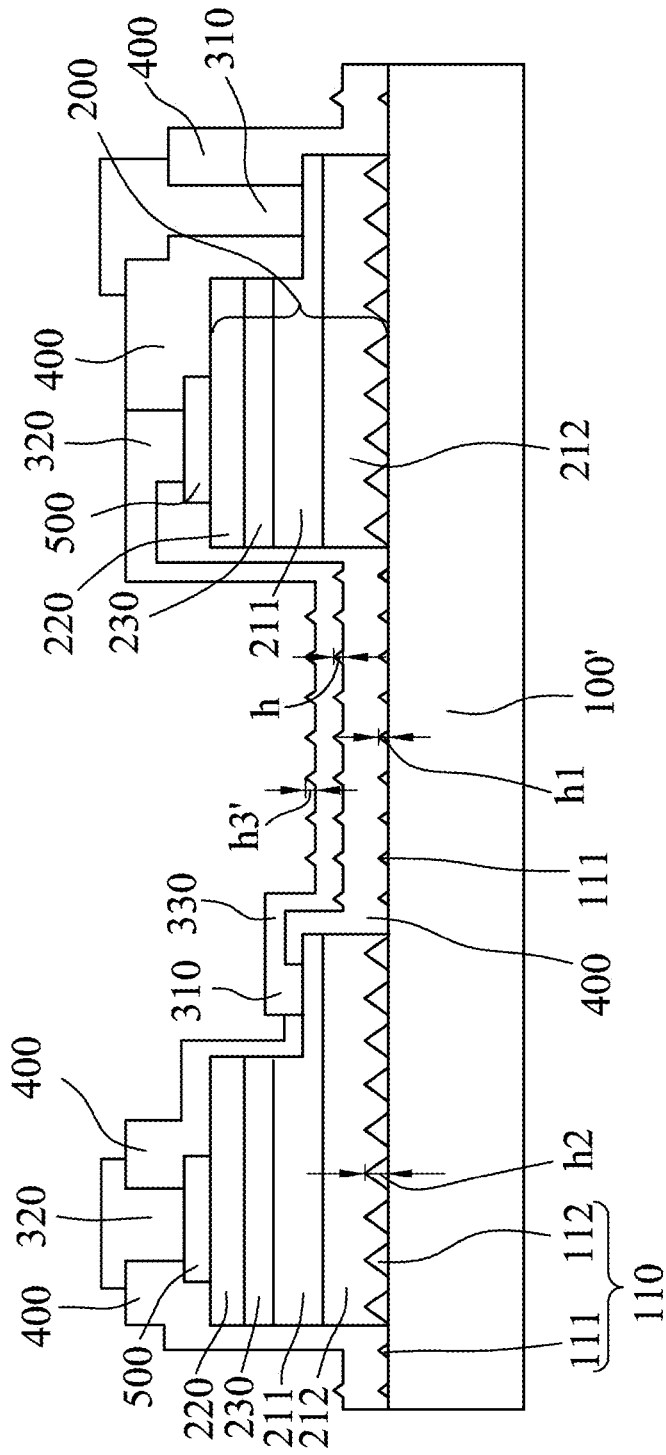
FIGS. 15 to 16 are schematic views illustrating a high-voltage flip-chip light-emitting device in accordance with some embodiments of the disclosure.
Figure 16:
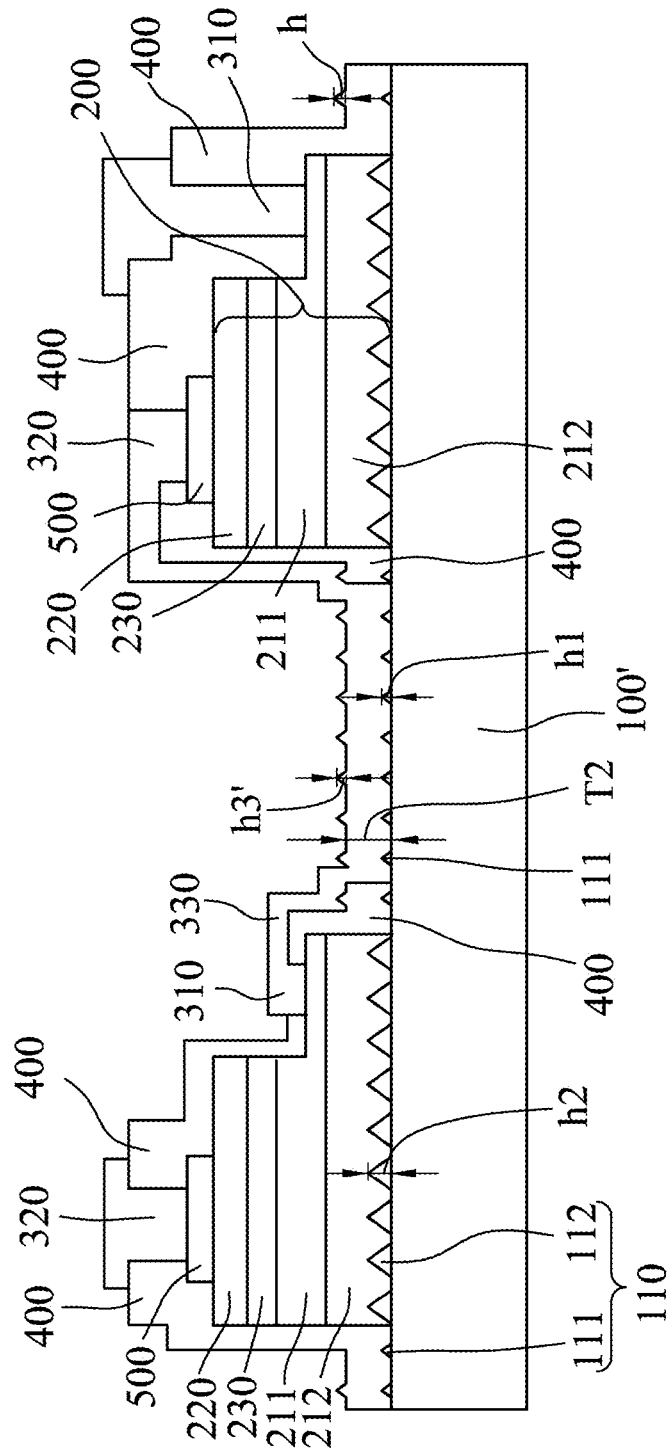

Referring to FIGS. 15 and 16, an embodiment of a high-voltage flip-chip light-emitting device includes at least two of the flip-chip LEDs as described in any one of the first embodiment to the sixth embodiment, and at least one metal bridge 330 that interconnects any two adjacent ones of the flip-chip LEDs in series or in parallel. In this embodiment, two of the flip-chip LEDs and the metal bridge 330 is exemplified, as shown in FIGS. 15 and 16. The substrates 100 of the two flip-chip LEDs is made of a single piece of a substrate unit 100'. The substrate-covering portions of the passivation layers 400 of the two flip-chip LEDs may be connected to each other or separated from each other to expose a portion of the substrate unit 100' between the two flip-chip LEDs. In some embodiments, the exposed portion of the substrate unit 100' is formed with the first protrusions 111 of any one of the two flip-chip LEDs.

In the case of the substrate-covering portions of the passivation layers 400 of the two flip-chip LEDs being connected to each other, the first patterned portions of the substrates 100 are completely covered by the substrate-covering portions of the passivation layers 400, as shown in FIG. 15. The metal bridge 330 is disposed on the substrate-covering portions of the passivation layers 400 and extends along the epitaxial-covering portions of the two flip-chip LEDs so as to electrically connect the first electrode 310 of one of the flip-chip LEDs to the second electrode 320 of the other one of the flip-chip LEDs. The metal bridge 330 has a top surface that is formed with undulations, each of which has an undulation height (h3'). In this embodiment, the undulation height (h3') of the at least one of the undulations is less than 2 μm. In some embodiments, the undulation height (h3') of the at least one of the undulations may be less than 1.5 μm or even less than 1 μm by further adjusting the size, the shape, the distribution of the first protrusions 111.

In the case of the substrate-covering portions of the passivation layers 400 of the two flip-chip LEDs being separated from each other, as shown in FIG. 16, the metal bridge 330 has a substrate-covering portion that is disposed on the exposed portion of the substrate unit 100' between the two flip-chip LEDs, and two extending portions that extend from the substrate-covering portion. The two extending portions respectively extend along the substrate-covering portions of the passivation layers 400 and the epitaxial-covering portions of the passivation layers 400 of the two flip-chip LEDs so as to electrically connect the first electrode 310 of one of the flip-chip LEDs and the second electrode 320 of the other one of the flip-chip LEDs, respectively.

The substrate-covering portion of the metal bridge 330 has a second thickness (T2) ranging from 0.1 μm to 5 μm. In some embodiments, the second thickness (T2) may range from 0.1 μm to 1 μm in order to further reduce the undulation height (h3'). In some embodiments, a ratio of the first average height (h1) of the first protrusions 111 to the second thickness (T2) of the substrate-covering portion of the metal bridge 330 is larger than 0.5. In some embodiments, the undulation height (h3') of the at least one of the undulations is less than 1.5 μm. In some embodiments, the undulation height (h3') of the at least one of the undulations is even less than 1 μm by further adjusting the size, the shape, the distribution of the first protrusions 111, especially the first protrusions 111 which are disposed beneath the metal bridge 330.

By adjusting the size, the shape, the distribution of the first protrusions 111, the passivation layer 400 would have a smooth and continuous surface. Therefore, the metal bridge 330 disposed on the passivation layer 400 with or without in contact with the substrate unit 100', can be made continuous, so as to improve the reliability of the high-voltage flip-chip LED device, thereby extending a lifetime of final products having the same.

Materials for making the at least one metal bridge 330 can be selected from one of high reflectance materials which includes silver.

In some embodiments, the high-voltage flip-chip light-emitting device has a dimension of 8 mil by 16 mil (200 μm by 400 μm) which can include two of the flip-chip LEDs each having a dimension of 8 mil by 8 mil, but is not limited thereto.

In the description above, for the purposes of explanation, numerous specific details have been set forth in order to provide a thorough understanding of the embodiments. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what are considered the exemplary embodiments, it is understood that this disclosure is not limited to the disclosed embodiments but is intended to cover various arrangements included within the spirit and scope of the broadest interpretation so as to encompass all such modifications and equivalent arrangements.

What is claimed is:

1. A flip-chip light-emitting diode comprising:
 a substrate having a patterned surface formed with a protrusion unit, said patterned surface having a first patterned portion and a second patterned portion, said protrusion unit including a plurality of first protrusions formed on said first patterned portion and a plurality of second protrusions formed on said second patterned portion;

a light-emitting epitaxial layer disposed on said substrate, said light-emitting epitaxial layer including a first semiconductor layer, a second semiconductor layer and an active layer, said first semiconductor layer being disposed on said second patterned portion of said substrate to expose said first patterned portion, said active layer being interposed between said first semiconductor layer and said second semiconductor layer;

a first electrode connected to said first semiconductor layer;

a second electrode connected to said second semiconductor layer; and a passivation layer having an epitaxial-covering portion disposed on said light-emitting epitaxial layer and a substrate-covering portion at least partially covering said first patterned portion of said substrate, wherein said substrate-covering portion of said passivation layer has a top surface that is formed with hillocks, at least one of said hillocks having a height lower than that of at least one of said second protrusions formed on said second patterned portion of said substrate.

2. The flip-chip light-emitting diode of claim 1, wherein said hillocks have a hillock average height, said second protrusions formed on said second patterned portion of said substrate having a second average height, the hillock average height being lower than the second average height.

3. The flip-chip light-emitting diode of claim 2, wherein said first protrusions formed on said first patterned portion have a first average height, the first average height being lower than the second average height.

4. The flip-chip light-emitting diode of claim 3, wherein a ratio of the first average height to the second average height ranges from 1:10 to 1:2.

5. The flip-chip light-emitting diode of claim 3, wherein the first average height is larger than 0 μm and no larger than 2.5 μm, the second average height ranging from 1 μm to 2.5 μm, a ratio of the second average height to the hillock average height being larger than 3.

6. The flip-chip light-emitting diode of claim 3, wherein said substrate-covering portion of said passivation layer has a first thickness ranging from 0.5 μm to 5 μm, a ratio of the first average height of said first protrusions to the first thickness of said substrate-covering portion of said passivation layer being larger than 0.5.

7. The flip-chip light-emitting diode of claim 2, wherein the hillock average height is larger than 0 μm and less than 1.5 μm.

8. The flip-chip light-emitting diode of claim 1, wherein each of said first protrusions and said second protrusions has a shape independently selected from a hemisphere, a platform, a cone, a triangular pyramid, a hexagonal pyramid, a cone-like shape, a triangular pyramid-like shape, and a hexagonal pyramid-like shape.

9. The flip-chip light-emitting diode of claim 8, wherein said first protrusions are partially formed with an upper part having a shape of a hemisphere or a platform.

10. The flip-chip light-emitting diode of claim 1, wherein any two adjacent ones of said first protrusions has a first spacing not smaller than 2 μm.

11. The flip-chip light-emitting diode of claim 1, wherein said first patterned portion of said substrate is completely covered by said substrate-covering portion of said passivation layer.

12. The flip-chip light-emitting diode of claim 1, wherein said passivation layer is made of an insulating material selected from silicon dioxide, silicon nitride, titanium oxide, tantalum oxide, niobium oxide, barium titanate and combinations thereof and is formed as a distributed Bragg reflector.

13. The flip-chip light-emitting diode of claim 1, wherein said flip-chip light-emitting diode has a length of a single side not larger than 250 μm.

14. The flip-chip light-emitting diode of claim 1, wherein said flip-chip light-emitting diode has a length ranging from 2 μm to 500 μm, a width ranging from 2 μm to 500 μm and a thickness ranging from 2 μm to 200 μm.

15. The flip-chip light-emitting diode of claim 1, wherein each of said second protrusions has a first part and a removable second part disposed on said first part, each of said first protrusions having said first part.

16. The flip-chip light-emitting diode of claim 15, wherein each of said second protrusions further has a third part disposed on said second part.

17. The flip-chip light-emitting diode of claim 15, wherein said first part has a smooth top surface.

18. The flip-chip light-emitting diode of claim 1, wherein said substrate is made of a material selected from sapphire, silicon, silicon carbide and gallium arsenide.

19. The flip-chip light-emitting diode of claim 1, wherein said light-emitting epitaxial layer further including a buffer layer that is interposed between said first semiconductor layer and said substrate, said light-emitting epitaxial layer being made of a material selected from group III nitride-based compound semiconductors.

20. A high-voltage flip-chip light-emitting device comprising:

at least two of flip-chip light-emitting diodes, each of said flip-chip light-emitting diodes including
a substrate having a patterned surface formed with a protrusion unit, said patterned surface having a first patterned portion and a second patterned portion, said protrusion unit including a plurality of first protrusions formed on said first patterned portion and a plurality of second protrusions formed on said second patterned portion,
a light-emitting epitaxial layer disposed on said substrate, said light-emitting epitaxial layer including a first semiconductor layer disposed on said second patterned portion of said substrate to expose said first patterned portion, a second semiconductor layer, and an active layer interposed between said first semiconductor layer and said second semiconductor layer,
a first electrode connected to said first semiconductor layer,
a second electrode connected to said second semiconductor layer, and
a passivation layer having an epitaxial-covering portion disposed on said light-emitting epitaxial layer and a substrate-covering portion at least partially covering said first patterned portion of said substrate, said substrates of said at least two flip-chip light-emitting diodes being interconnected to form a substrate unit; and at least one metal bridge that interconnects any two adjacent ones of said flip-chip light-emitting diodes, wherein, said metal bridge has a top surface that is formed with undulations, at least one of said undulations having an undulation height of less than 1.5 μm.

21. The high-voltage flip-chip light-emitting device of claim 20, wherein said substrate-covering portion of said passivation layer partially covers said substrate unit to expose a portion of said substrate unit, said metal bridge being disposed on said exposed portion of said substrate unit.

22. The high-voltage flip-chip light-emitting device of claim 20, wherein the undulation height of said at least one of said undulations is less than 1 μm.

* * * * *